United States Patent
Gabato, Jr. et al.

(10) Patent No.: US 7,202,719 B2
(45) Date of Patent: Apr. 10, 2007

(54) METHOD AND APPARATUS FOR FREQUENCY SYNTHESIS

(75) Inventors: Manuel P. Gabato, Jr., Elmhurst, IL (US); Joseph A. Charaska, Melrose Park, IL (US); Paul H. Gailus, Prospect Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 9 days.

(21) Appl. No.: 10/955,469

(22) Filed: Sep. 30, 2004

(65) Prior Publication Data

US 2006/0066368 A1 Mar. 30, 2006

(51) Int. Cl.
*H03L 7/06* (2006.01)

(52) U.S. Cl. .................. 327/158; 327/149
(58) Field of Classification Search .......... None
See application file for complete search history.

(56) References Cited

U.S. PATENT DOCUMENTS

| | | | |
|---|---|---|---|
| 6,100,735 A * | 8/2000 | Lu .............. | 327/158 |
| 6,104,223 A | 8/2000 | Chapman et al. | |
| 6,353,649 B1 * | 3/2002 | Bockleman et al. ...... | 375/376 |
| 6,469,493 B1 * | 10/2002 | Muething et al. ...... | 324/158.1 |
| 6,510,191 B2 | 1/2003 | Bockelman | |
| 6,628,154 B2 * | 9/2003 | Fiscus .............. | 327/158 |
| 6,657,936 B2 * | 12/2003 | Harvey et al. ......... | 369/59.12 |
| 6,794,913 B1 * | 9/2004 | Stengel .............. | 327/158 |
| 7,038,511 B2 * | 5/2006 | Kim et al. .............. | 375/376 |
| 2003/0058004 A1 * | 3/2003 | Stengel et al. .......... | 327/105 |
| 2003/0099321 A1 | 5/2003 | Juan et al. | |

* cited by examiner

*Primary Examiner*—Timothy P. Callahan
*Assistant Examiner*—Cassandra Cox
(74) *Attorney, Agent, or Firm*—Valerie M. Davis

(57) ABSTRACT

A DPC (200) that includes: a frequency source (20); a delay-locked loop (220) for receiving a clock signal and generating a plurality of phase-shifted clock signals; a control device (280) having a DPS (282) and a DAC (284) for receiving an input signal identifying a desired frequency for a synthesized signal; a selection circuit (270) for receiving the plurality of phase-shifted clock signals, selecting a sequence of the phase-shifted clock signals and outputting a coarse synthesized signal; a variable delay cell (290) having a first input coupled to the selection circuit to receive the coarse synthesized signal and a second input coupled to the control device for receiving a fine tune adjustment signal to modify the coarse synthesized signal to generate the synthesized signal (292) having substantially the desired frequency. The DPC further includes training apparatus for calibrating the DPC.

20 Claims, 10 Drawing Sheets

METHOD AND APPARATUS FOR FREQUENCY SYNTHESIS

FIELD OF THE INVENTION

The present invention relates generally to frequency synthesis and more specifically to a digital-to-phase converter that enables fine frequency selection using a variable delay cell.

BACKGROUND OF THE INVENTION

A number of devices, for instance mobile applications such as portable devices, require the use of a frequency synthesizer for operation. One such frequency synthesizer includes a digital-to-phase converter (DPC) having a delay-locked loop (DLL). FIG. 1 illustrates a block diagram of a prior art DPC 10 configuration for generating an output signal 82 at a desired frequency $F_{out}$. DPC 10 comprises a fixed frequency source 20 for generating a clock signal 22 having a frequency of $F_{clk}$. DPC 10 further comprises: a delay-locked loop 30 that includes a primary delay line 32 having N number of adjustable delay elements D1 through DN and a phase detector 40, a charge pump 50 and a low pass filter 60, which make up a stabilization circuit for DLL 30; a plurality of cascaded delay lines 70 (e.g., delay lines DL0 through DL(N-1) that each include a plurality of delay elements (not shown); a selection circuit 80 that may be, for instance, a multiplexer (also referred to herein as a "MUX"); and a digital control device 90 such as, for instance, a digital-to-phase sequencer (DPS).

In operation, delay line 32 receives the clock signal 22 into an input and then generates a set of time delayed (or phase-shifted) clock signals at a plurality of outputs. The time delays are generated by delay elements D1 through DN, which are connected in cascade and which may be, for instance, inverter gates, transmission line gates, and the like, depending upon a desired DPC implementation. Moreover, an overall time delay between a signal at a first point on the delay line, which is typically an input of the first delay element D1, and a signal at a second point on the delay line, which is typically the output of the Nth delay element DN, is controlled by a control signal, e.g., a bias voltage $V_{tune}$, input into delay line 32. This overall delay may be, for instance, a wavelength (i.e., 360 degrees) which is one period of clock signal 22, a half wavelength (i.e., 180 degrees) which is one half period of clock signal 22, or whatever delay is required for a particular application. Ideally, each delay element will replicate the input waveform, with a time delay, at the delay element output that is equal to the total delay from the input of delay element D1 through the output of delay element DN divided by the total number of delay elements (i.e., N).

Each delay element D1-D(N-1) has an output tap T1-T(N-1), respectively, which is connected to an input of a respective delay line DL of the plurality of delay lines 70. In addition, a tap T0 is connected between the input of the delay element D1 and an input of delay line DL0. Each delay element D1-D(N-1) delays the propagation of the clock signal 22 and outputs on its corresponding output tap T1-T(N-1), respectively, a corresponding phase-shifted clock signal. Accordingly, the number N-1 of phase-shifted clock signals output by delay elements D1-D(N-1) are supplied via output taps T1-T(N-1) to the inputs of cascaded delay lines DL1 through DL(N-1) along with the clock signal 22 output (i.e., a zero time delay) on tap T0.

To ensure stability during operation, DPC 10 includes phase detector 40 that is typically connected to receive the clock signal 22 from source 20 and a phase-shifted clock signal from delay line 32, which in this instance is the signal at the output of delay element DN. Phase detector 40 compares the phase difference between the clock signal 22 and the phase-shifted clock signal to a predetermined desired phase shift and outputs to the charge pump an error signal that is a function of the result of this comparison.

The charge pump 50 deposits a corresponding charge on the low pass filter 60, which in turn converts the error signal into a DLL tuning signal that is supplied to delay line 32 to adjust the bias voltage $V_{tune}$ in a manner that maintains the phase relationship between the phase-shifted clock signal and the clock signal 22 during operation of DLL 30, i.e., until the total delay through the delay line 32 is the desired delay. Once DLL 30 has stabilized, MUX 80 operates in a conventional way under the control of DPS 90 to connect, one at a time, a sequence of phase-shifted clock signals to the output of MUX 80 to provide an output signal 82 at the desired output frequency $F_{out}$.

A high speed accumulator is typically used as the core of DPS 90 whose digital input 92 is used to program the desired frequency and whose digital output 94 is used by MUX 80 to select the appropriate delay path for the desired output edge of the synthesized output clock 82. The DPS 10 thus provides a coarse delay select and a fine delay select. The coarse delay is provided by the delay elements in the primary delay line 32, and the fine delay is provided by the array of preferably passive delay lines 70 that are cascaded after the outputs of each of the coarse delay elements. The end result of this implementation is the generation of a multiplicity of clock edges that are delayed in time over ideally 1 period of the input reference clock.

These edge times are said to be quantized based on the cumulative delay of each delay element in a delay path. By properly decoding the DPS output, it is possible to synthesize a clock with a different frequency than the input reference clock. It is known that the spurious performance of DPC 10 is inversely related to the number of delay elements included in DPC 10. Thus, to obtain the spurious requirements for certain applications, thousands of delay elements or quantization steps would be required. However, this presents implementation problems.

For example, depending on the number of delay elements required, it may not be possible to integrate all of the delay elements onto a single integrated circuit. Moreover, if an active delay cell approach were used, this would negatively impact overall current drain. Nonetheless, if a passive delay cell (e.g. a transmission line) approach were used, the performance of the DPC would be highly susceptible to process variation (which could negatively impact monotonicity) due to mismatch or loading and result in a loss of performance. In addition, the passive delay element approach is not portable to future IC technologies. This is because a frequency synthesizer designed for a specific process will have its components designed for that process in order to maximize the performance of the synthesizer. This would likely necessitate the frequency synthesizer being redesigned for each additional alternative process to accordingly maximize its performance for those processes.

Thus, there exists a need for a method and apparatus for frequency synthesis that uses a significantly fewer number of delay elements to achieve comparable accuracy and spurious performance to frequency synthesizers known in the art.

BRIEF DESCRIPTION OF THE FIGURES

A preferred embodiment of the invention is now described, by way of example only, with reference to the accompanying figures in which.

DETAILED DESCRIPTION OF THE INVENTION

Figure 1:
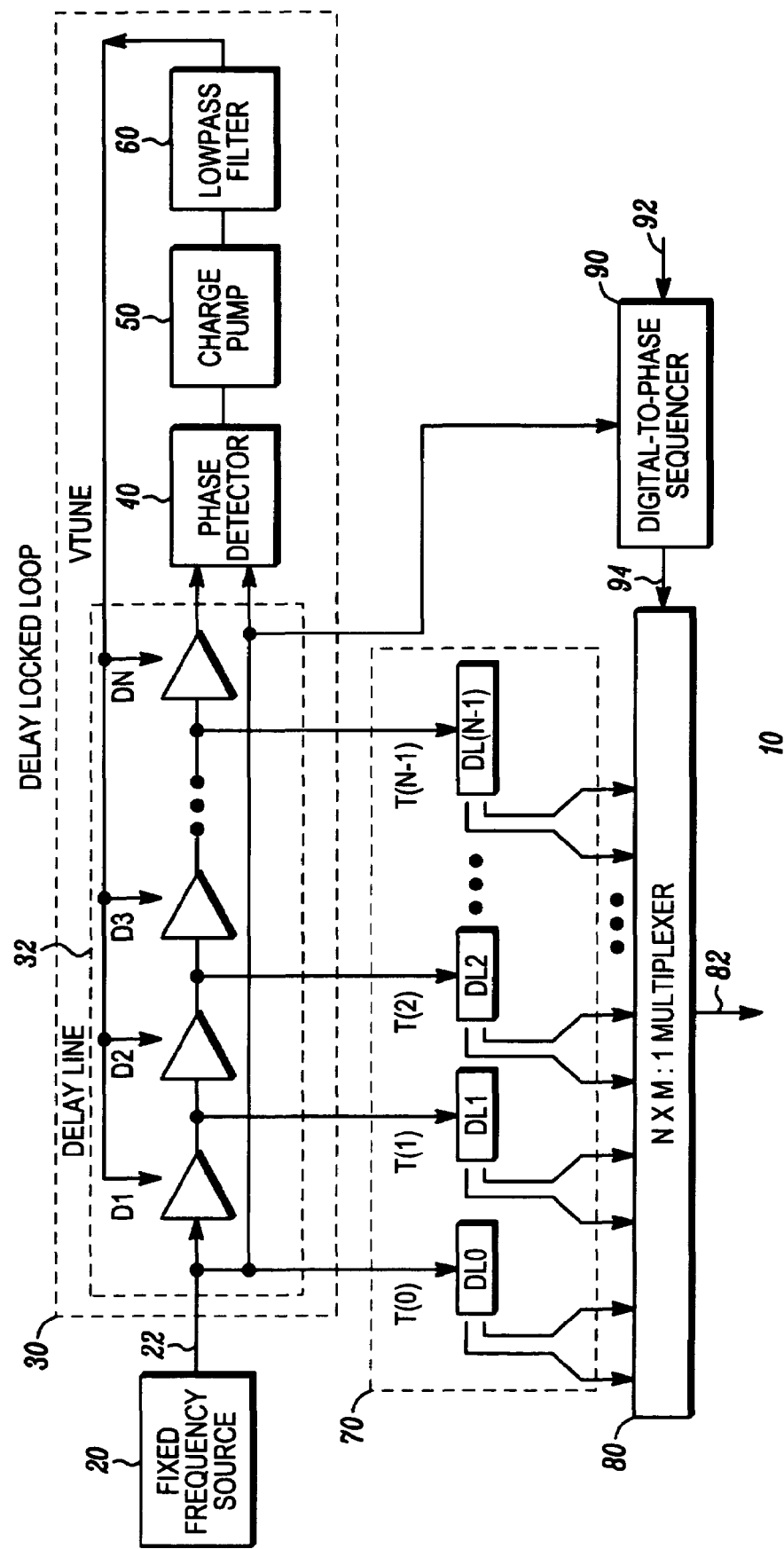
FIG. 1 illustrates a block diagram of a prior art digital-to-phase converter.

While this invention is susceptible of embodiments in many different forms, there are shown in the figures and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. It will also be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

Figure 2:
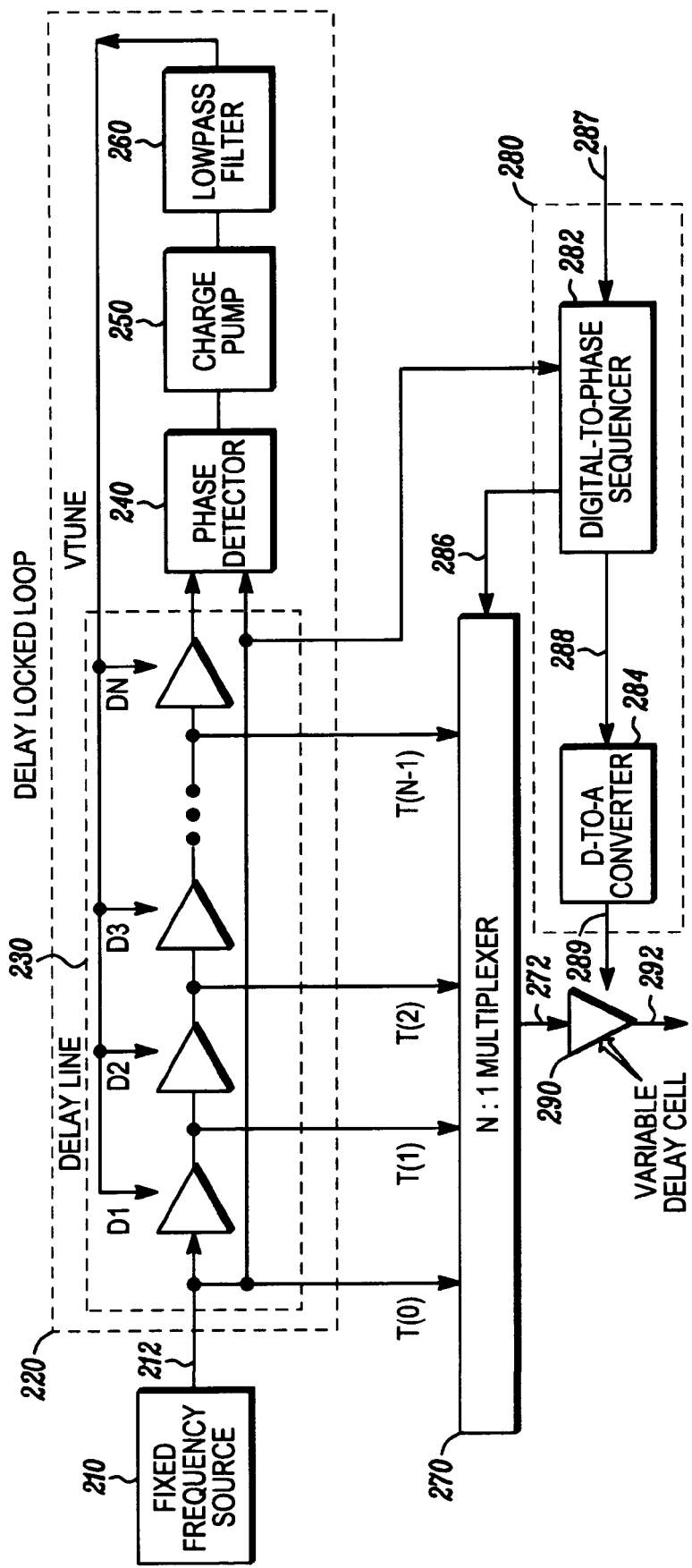
FIG. 2 illustrates a block diagram of a digital-to-phase converter in accordance with an embodiment of the present invention.

FIG. 2 illustrates a block diagram of a DPC 200 in accordance with an embodiment of the present invention for generating a synthesized output signal 292 at a desired frequency $F_{out}$. DPC 200 comprises a fixed frequency source 210 for providing a clock signal 212 having a frequency of $F_{clk}$. DPC 200 further comprises: a DLL 220 that includes a delay line 230 having N number of adjustable delay elements D1 through DN and may also optionally include a stabilization circuit ideally having a phase detector 240, a charge pump 250 and a low pass filter 260; a selection circuit 270 that may be, for instance, a multiplexer; a control device 280 that is a suitable processing device and that ideally includes a digital-to-phase sequencer 282 and a digital-to-analog converter (DAC) 284; and a variable delay cell 290.

In operation, delay line 230 receives the clock signal 212 into an input and then generates a set of time delayed clock signals at a plurality of outputs. The time delays are generated by delay elements D1 through DN, which are connected in cascade and which may be, for instance, inverter gates, transmission line gates, and the like, depending upon a desired DLL 220 implementation. Moreover, an overall time delay between a signal at a first point on the delay line, which is typically an input of the first delay element D1, and a signal at a second point on the delay line, which is typically the output of the Nth delay element DN, is controlled by a control signal, e.g., a bias voltage $V_{tune}$, input into delay line 230. This overall delay may be, for instance, a wavelength (i.e., 360 degrees) which is one period of clock signal 22, a half wavelength (i.e., 180 degrees) which is one half period of clock signal 22, or whatever delay is required for a particular application. Ideally the overall delay is one period of the clock signal. Moreover, ideally each delay element will replicate the input waveform, with a time delay, at the delay element output that is equal to the total delay from the input of delay element D1 through the output of delay element DN divided by the total number of delay elements (i.e., N).

Delay elements D1 through D(N−1) each have an output tap T1 through T(N−1), respectively, which is connected to an input of MUX 270. In addition, a tap T0 is connected between the input of the delay element D1 and MUX 270 in order to supply the clock signal 212 thereto. Each delay element D1-D(N−1) delays the propagation of the clock signal 212 and outputs on its corresponding output tap T1-T(N−1), respectively, a corresponding phase-shifted clock signal. Accordingly, the number N−1 of phase-shifted clock signals output by delay elements D1-D(N−1) are supplied via output taps T1-T(N−1) to the inputs of MUX 270 along with the clock signal 212 output (i.e., zero time delay) on tap T0. In the present embodiment, taps 0 through N−1 are used as output taps. However, those of ordinary skill in the art will realize that taps 1 through N may, alternatively, be used as the output taps without departing from the present invention.

Phase detector 240, charge pump 250 and low pass filter 260 that comprise the stabilization circuit of DLL 220 function to stabilize the delay line 230 to substantially a predetermined desired phase shift between two points on the delay line. The delay line is ideally stabilized to within a range of the desired phase shift that corresponds to an acceptable spurious level at the output 292 depending on a particular application.

Accordingly, phase detector 240 is typically connected to receive the clock signal 212 from frequency source 210 and a phase-shifted clock signal from delay line 230, which in this instance is the signal at the output of delay element DN. Phase detector 240 compares the phase difference between the clock signal 212 and the phase-shifted clock signal to a predetermined desired phase shift and outputs to the charge pump an error signal that is a function of the result of this comparison. Those of ordinary skill in the art should realize that phase detector 240 could be configured for comparing the phase difference between the signals at any two points on the delay line to the predetermined desired phase shift and outputting the corresponding error signal. The charge pump 250 deposits a corresponding charge on the low pass filter 260, which in turn converts the error signal into a DLL tuning signal which is supplied to delay line 230 to adjust the bias voltage $V^{tune}$ in a manner that maintains the phase relationship between the phase-shifted clock signal and the clock signal 212 during operation of DLL 220, i.e., until the total delay through the delay line is substantially the desired delay.

Once DLL 220 has stabilized, MUX 270 operates under the control of control device 280 to connect, one at a time, a sequence of phase-shifted clock signals at taps T0-T(N−1) to the output of MUX 270 to generate a coarse synthesized signal 272 comprising a plurality of coarse clock edges that are based on the sequence of selected phase-shifted clock signals. Variable delay cell 290 also operates under the control of control device 280 to modify or "fine tune" this coarse synthesized signal by modifying the delay of at least a portion of the plurality of coarse clock edges to generate a fine synthesized output signal 292 having a frequency that is substantially the desired frequency, i.e., within a tolerance that corresponds to an acceptable spurious level at the output of DPC 200 depending upon the particular application.

Figure 3:
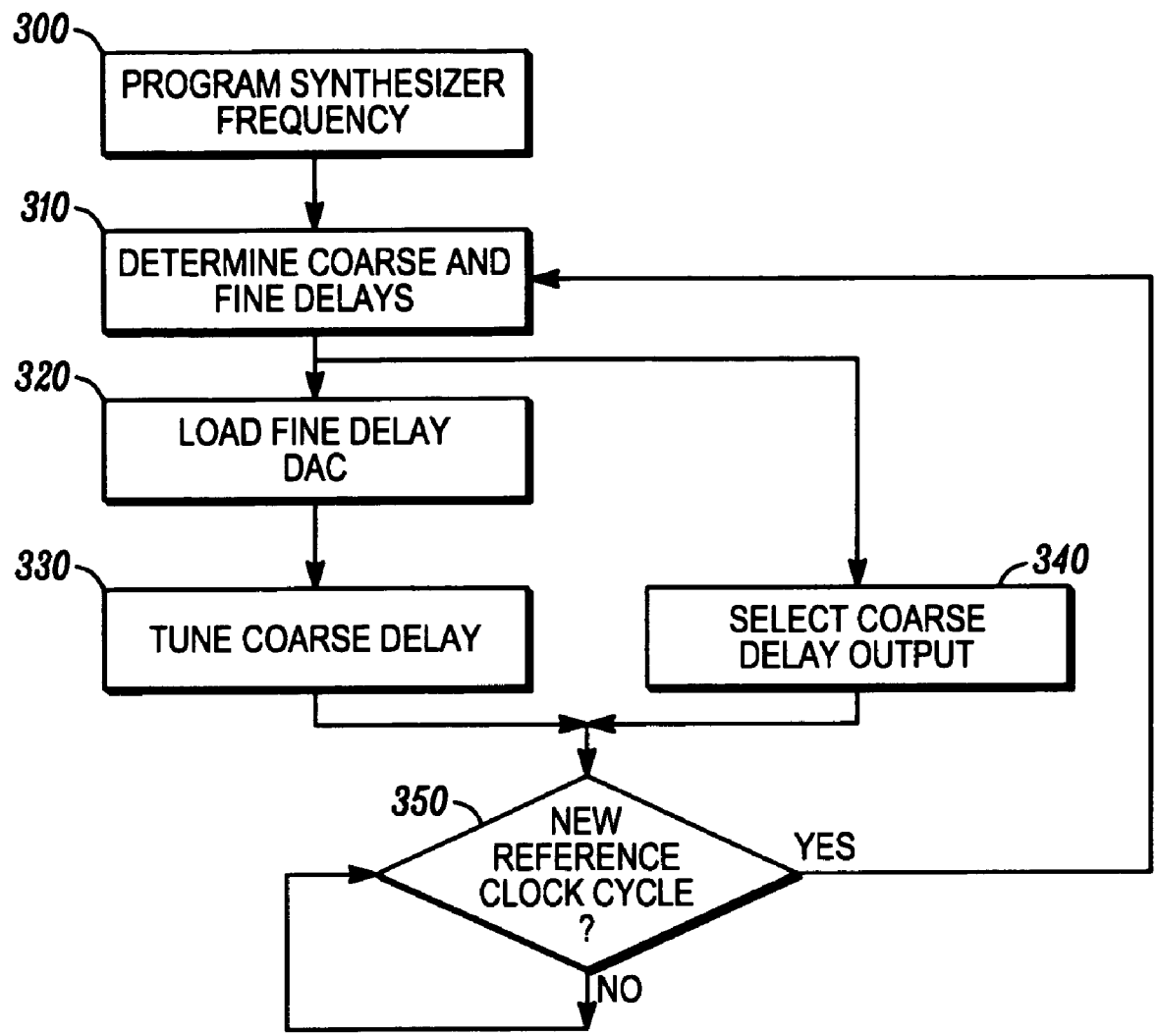
FIG. 3 illustrates a flow diagram of a method in accordance with an embodiment of the present invention for generating a synthesized output signal having a desired frequency.

FIG. 3 illustrates a flow diagram of a method in accordance with an embodiment of the present invention for generating a synthesized output signal having substantially a desired frequency. This method may be used, for example, in the DPC of FIG. 2. At step 300, input signal 287 (that is ideally digital) identifying the desired $F_{out}$ is provided to control device 280 generally by a source external to DPC 200 (such as, for instance, a digital signal processor or other microcontroller that resides within a device that also houses the DPC 200) and is ideally received into DPS 282. A high speed accumulator, for example, may be used as the core of DPS 282 for generating (310) a coarse selection signal 286 and a corresponding fine tune adjustment signal 288, ideally once at every clock edge of the reference clock. The coarse selection signal could be generated based upon, for example, a plurality of digital words stored in a look-up table or computed by the control device on the fly. The fine tune adjustment signal is ideally generated based upon a plurality of calibration values stored in a memory device that may, for instance, be included in the control device 280 and that are ideally determined during the training sequence explained in detail below.

The coarse selection signal 286 is loaded into and used by MUX 270 to select the appropriate output tap (340), one of T0-T(N−1), to provide a coarse synthesized signal 272 (i.e., coarse clock edge 272) to variable delay cell 290. This coarse clock edge is ideally selected as close as possible to the desired clock edge for the output synthesized signal. The variable delay cell 290 then fine tunes (330) the coarse clock edge 272 under the control (320) of the corresponding fine tune adjustment signal 289 from control device 280 to generate fine synthesized output signal 292 (i.e., an output clock edge that is ideally substantially the desired output clock edge). The method then continues (350) with the next reference clock cycle, such that a synthesized output signal 292 is generated having a sequence of values that represent clock edges occurring at a frequency that is substantially the desired $F_{out}$. Thus, the accumulation of each of the clock edges results in a synthesized clock that may be of a different frequency from the input reference clock frequency.

Figure 4:
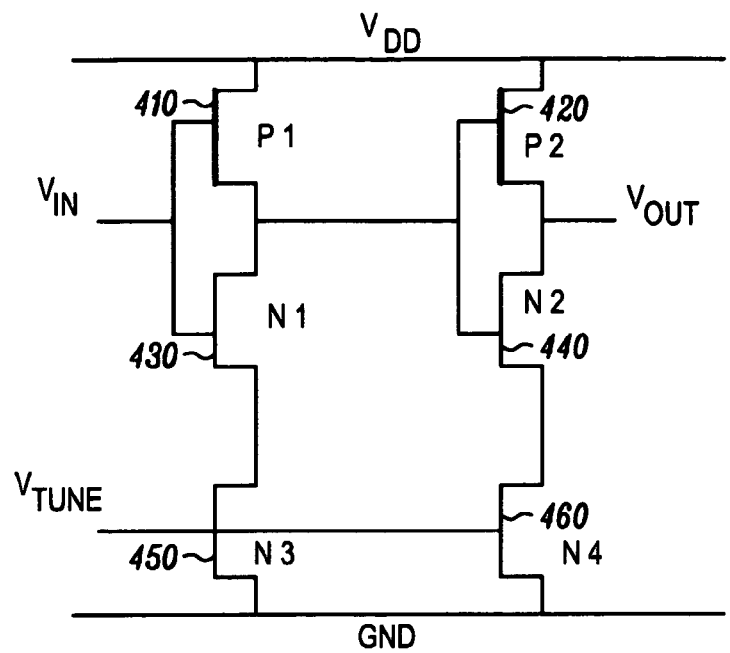
FIG. 4 illustrates a schematic diagram of an embodiment of a variable delay cell that may be used in the digital-to-phase converter of FIG. 2.

FIG. 4 illustrates a schematic diagram of an embodiment of a variable delay cell 400 that may be used in DPC 200, i.e., a CMOS buffer with a bias control $V_{dd}$ that is externally adjustable. Variable delay cell 400 includes a plurality of ideally CMOS transistors, which include two P-type transistors 410 and 420 (i.e., P1 and P2) and four N-type transistors 430, 440, 450 and 460 (i.e. N1, N2, N3 and N4) coupled into the configuration illustrated in FIG. 4. In this embodiment, signal 272 provides for a voltage value to be supplied to the variable delay cell at $V_{in}$. The fine tune adjustment signal 289 likewise provides for a voltage to be supplied to the variable delay cell at $V_{Tune}$, and the resulting output is also a voltage generated by the variable delay cell at $V_{out}$ and corresponding to signal 292. Since the variable delay cell demonstrated requires analog inputs, the embodiment of the DPC illustrated in FIG. 2 ideally includes a DAC 284 to convert a digital fine tune adjustment value 288 from the DPS 282 into the analog signal 289 used by the variable delay cell.

Those of ordinary skill in the art will realize that variable delay cell 400 is exemplary and that additional embodiments of the variable delay cell used in FIG. 2 may be implemented. For example, in another embodiment instead of using a DAC, suitable circuitry for converting the digital fine tune adjustment value into a fine tune adjustment signal may be included in the variable delay cell.

Figure 5:
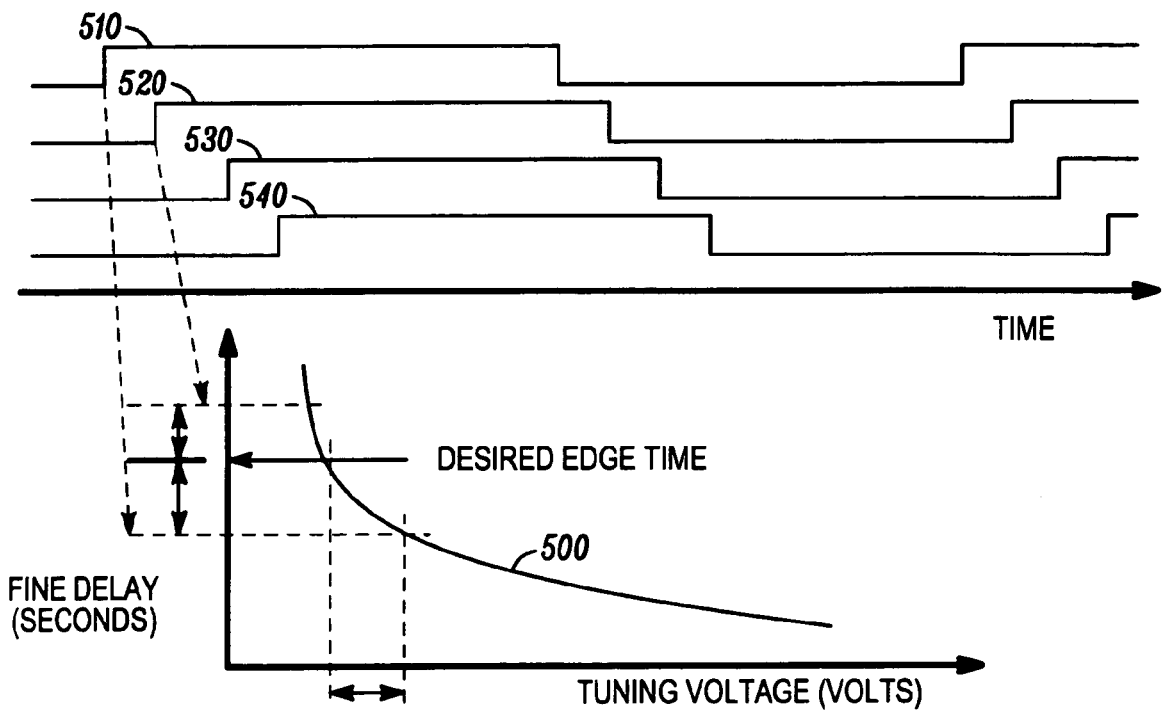
FIG. 5 illustrates a timing diagram and a transfer function for the variable delay cell of FIG. 4 that demonstrate coarse delay selection and fine delay tuning in accordance with an embodiment of the present invention.

FIG. 5 illustrates the process of the DPS generating the appropriate coarse selection signal and fine tune adjustment signal for generating a desired edge time. Shown in FIG. 5 is the transfer function 500 for a typical variable delay cell (e.g., variable delay cell 400), and waveforms 510, 520, 530 and 540 represent the clock signal delayed in varying amounts by four successive delay elements in delay line 230. At each clock cycle of the input reference clock signal 212, the DPS would generate a coarse selection signal that would cause the MUX 270 to select a tap output that would generate a coarse clock edge 272 at the MUX output that was ideally closest to the desired output clock edge (e.g., the clock edge from phase-shifted clock signal 510 or 520).

The DPS would simultaneously determine the fine tune adjustment value 288, and this digital value would be converted to an analog signal, via a DAC process, which would be used by the variable delay cell to delay the coarse clock edge so that it would be as close as possible to the desired clock edge as also indicated in FIG. 5. A primary benefit of the DAC process is the capability of increasing the levels of delay quantization. More specifically, finer levels of delay quantization could be attained by increasing the number of bits in the DAC.

In any digital-to-analog conversion process, non-linearities exist. Note the non-linear delay transfer function 500 of the variable delay cell illustrated in FIG. 4. This transfer function is typically non-linear over a wide range of tuning voltages. Such non-linearity will result in a reduction of spurious performance. In order to improve spurious performance, a method of measuring the non-linearity and compensating for it is necessary. This method or process is referred to herein as training.

The backbone of any training system is an accurate reference. For example, in the embodiments of the present invention discussed above, an accurate time reference is required because the illustrated transfer function 500, of the variable delay cell that requires training, is expressed in tuning voltage versus time. An accurate time reference may be created, for instance, using a second DLL with a different number of delay elements, wherein the total delay across all of these delay elements is ideally the same overall delay as for the first DLL. The second DLL would ideally function as described above by reference to the DLL 220 of FIG. 2 and would ideally include a stabilization circuit as described in detail above (comprising a phase detector, a charge pump and a low pass filter) and may have either more or fewer delay elements than DLL 220 depending upon the implementation.

Figure 6:
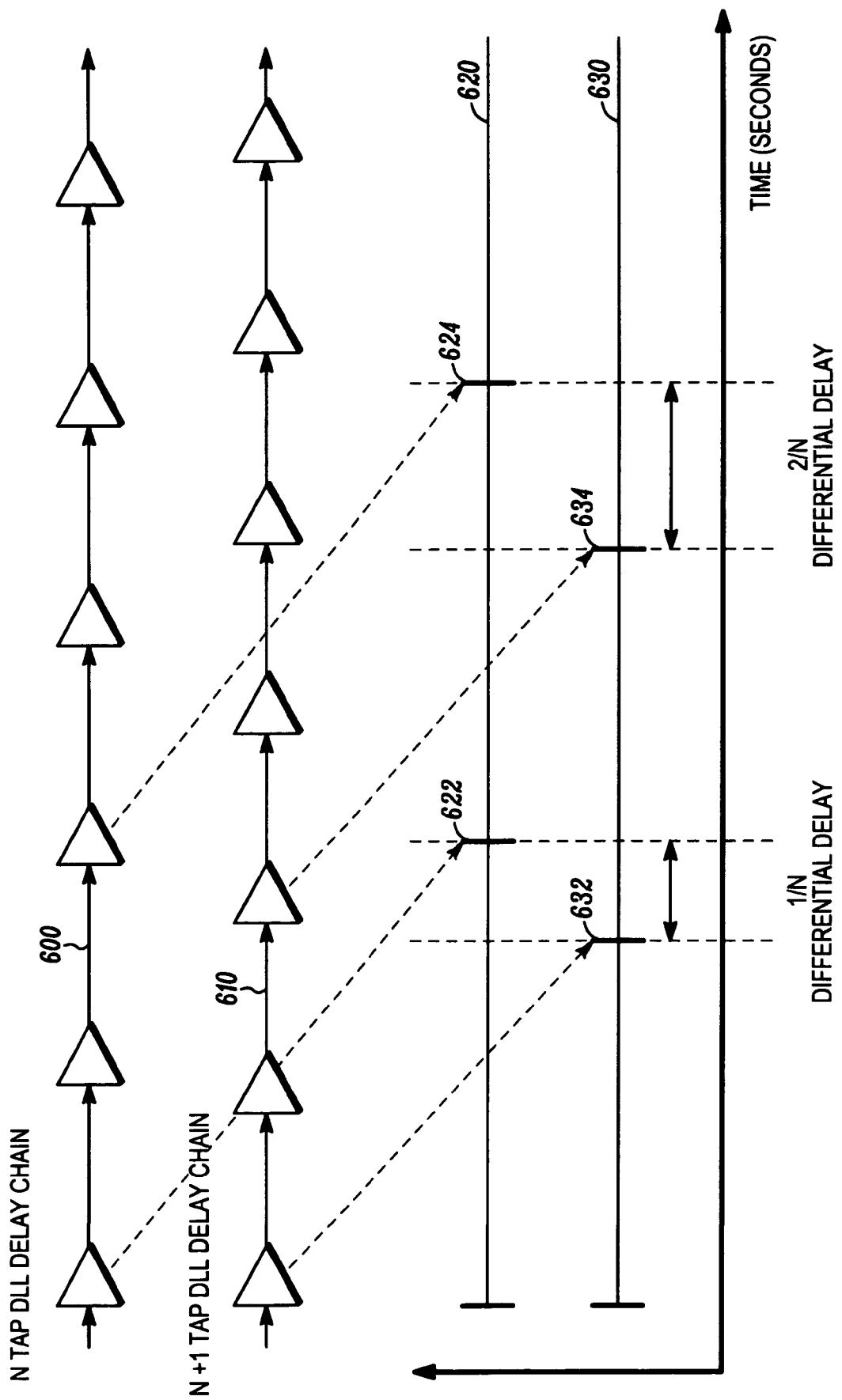
FIG. 6 illustrates two delay lines and corresponding timing diagrams for generating a time reference for performing a training sequence in accordance with an embodiment of the present invention.

FIG. 6 illustrates how a suitable time reference may be created for performing a training function within, for example, DPC 200 illustrated in FIG. 2. Shown in FIG. 6 is an N tap DLL delay chain 600 with N delay elements (e.g., delay line 230) and an N+1 tap DLL delay chain 610 with N+1 delay elements (e.g., the second delay line). Also illustrated is a timing diagram 620 corresponding to delay line 600 and having exemplary output edges 622 and 624 from two of the N delay elements in delay line 600. Further illustrated is a timing diagram 630 corresponding to delay line 610 and having exemplary output edges 632 and 634 from two of the N+1 delay elements in delay line 610.

In this implementation, the delay per element will be slightly smaller in delay line 610. Accordingly, if delay line 600 has N delay elements and the delay line 610 has N+1 delay elements, the differential delays become 1/N (i.e., the timing difference between output edges 632 and 622), 2/N (i.e., the timing difference between output edges 634 and 624), . . . , (N−1)/N, as further illustrated in FIG. 6. Thus, the purpose of having two DLLs with a different number of delay elements is to create a "ruler" or reference that can be used to calibrate the DPC. What is, thereby, generated is a plurality of differential delays, with each differential delay increasing by a known amount. Each differential delay then functions as a standard unit of measurement of time that can be used to calibrate the DPC.

Figure 7:
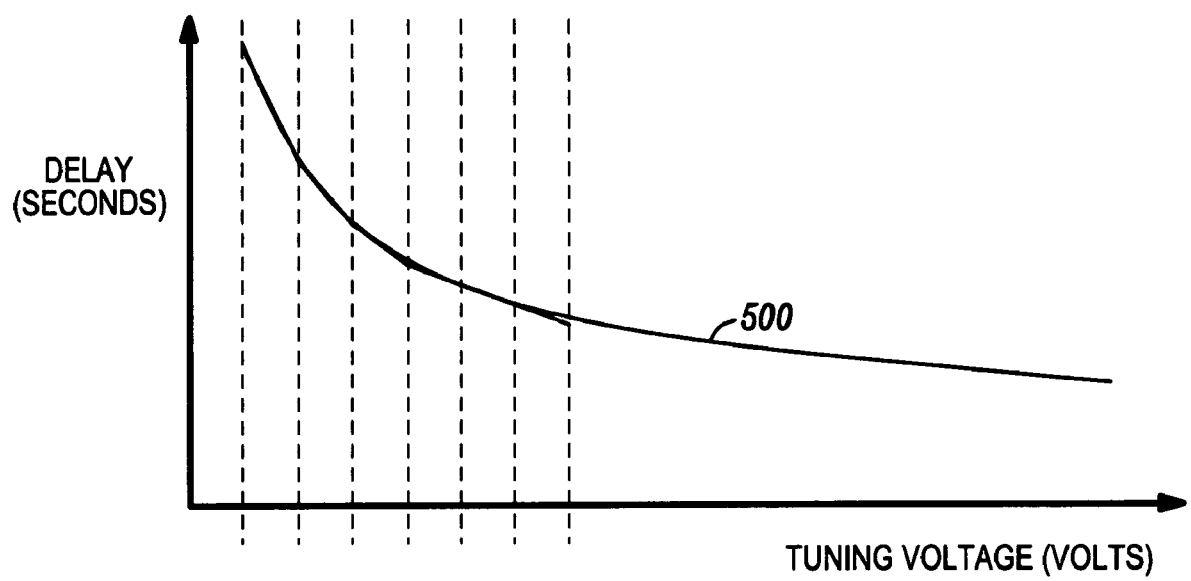
FIG. 7 illustrates a training function applied to the transfer function of FIG. 5 in accordance with an embodiment of the present invention.

More specifically, each differential delay can be used to subdivide the non-linear delay transfer function 500 of the variable delay cell 400 and train the DPC using, in one embodiment, a linear approximation technique as shown in FIG. 7. Training can be accomplished by using a similar process as the process that is used in locking a DLL. For example, by selecting an output from the N tap DLL, feeding it to the variable delay cell and comparing its output to an output from the N+1 tap DLL, it is possible to tune the variable delay cell so that the variable delay cell will make the two edges coincident. When the two edges are coincident, the system has been trained for one point on the delay transfer function curve 500 of FIG. 7.

This process is ideally repeated a number of times equal to the number of delay elements in the first delay line (e.g., N times in the implementation illustrated in FIG. 6) for generating a plurality of calibration points on transfer function curve 500. Training can be performed at any time, for example the first time a device that requires training is powered-up. In another embodiment, the device may perform the training function based upon an algorithm or upon particular parameters being present that may lead to degradation in overall system performance. These parameters may include, for instance, increased operating temperature, decreased operating voltage, newly desired output frequency, etc.

In other words, training using this second DLL involves tuning the variable delay cell's quiescent current at a plurality of points so that an initial delay of a signal from the variable delay cell (caused by a tap output from delay line 600) compensates for an offset delay of a signal from a corresponding tap output from delay line 610. Once training is complete, a set of calibration points on the transfer function curve have been determined and corresponding calibration values, e.g., digital words, can be computed and ideally stored. Moreover, an interpolation method may be used with at least two of the calibration values to compute additional calibration values further reducing overall phase error (and correspondingly improving the spurious performance) of the system based upon the number of calibration values allowable by the DAC process (e.g., based upon the number of bits in the DAC).

Figure 8:
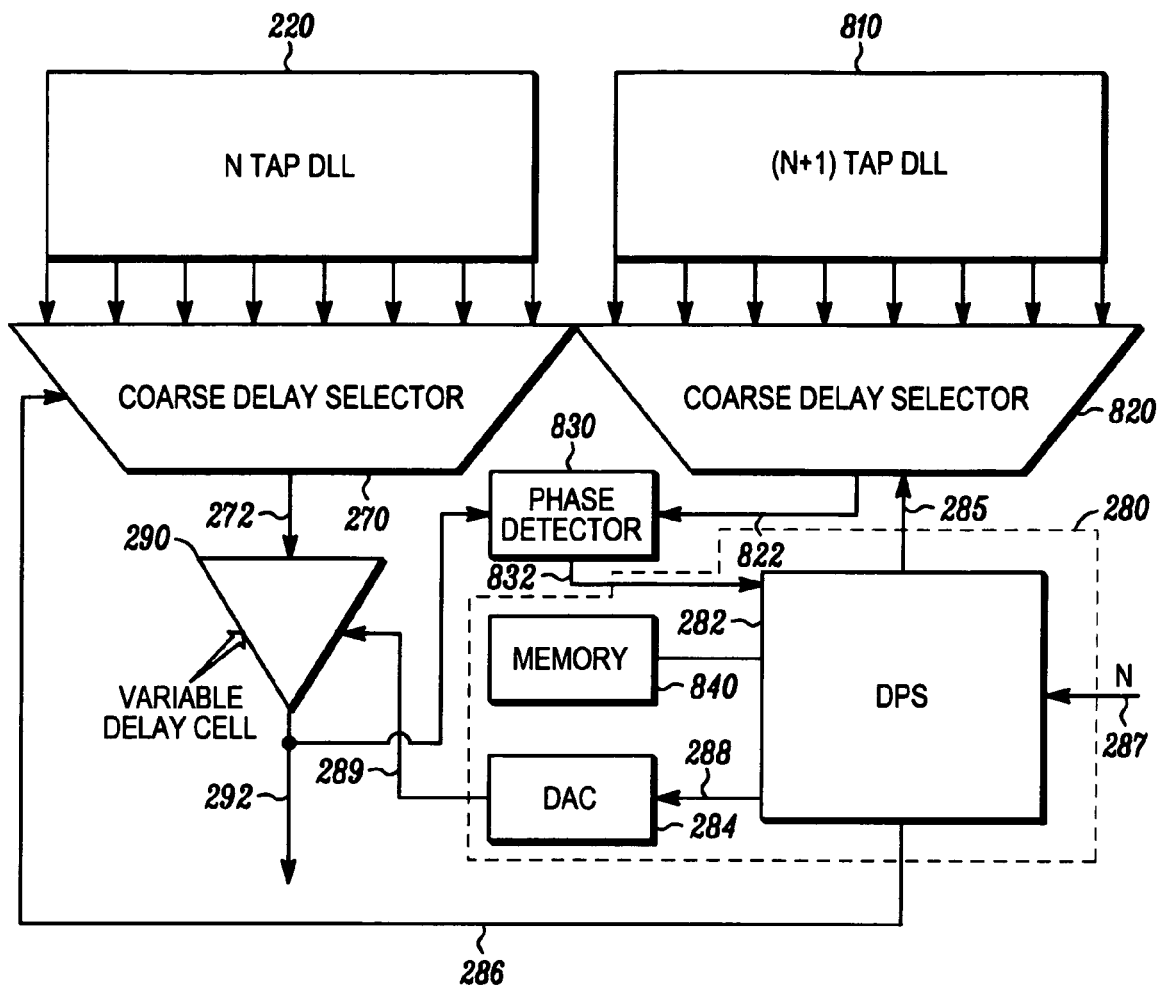
FIG. 8 illustrates a block diagram of a digital-to-phase converter that includes apparatus for performing a training sequence in accordance with an embodiment of the present invention.

One advantage of using the second DLL approach to train the variable delay cell is that apparatus for training can easily and relatively inexpensively be incorporated into the same device, e.g., communication device, as the DPC. This eliminates the need to use large and expensive calibration equipment that is external to the device including the DPC, and calibration or training can be performed when necessary or desirable in a manner, for example, as discussed above. FIG. 8 illustrates a block diagram of a DPC 800, which is in effect the DPC 200 of FIG. 2 including training apparatus. Thus, the elements that are identical to the elements of FIG. 2 are accordingly identically labeled in FIG. 8. DPC 800 includes a DLL 220 with a delay line (not shown) having N delay elements; a coarse delay selector (or multiplexer) 270; a control device 280 preferably including a DPS 282 and a DAC 284; and a variable delay cell 290. These elements of DPC 800 have the same functionality as described in detail above by reference to FIG. 2, which will not be repeated here for the sake of brevity. DPC 800 further includes training apparatus that ideally comprises: a DLL 810 with a delay line (not shown) having N+1 delay elements, which is identical in structure and functionality to DLL 220 but having a different number of delay elements; a coarse delay selector (or multiplexer) 820, which is identical in structure and functionality to coarse delay selector 270; and a phase detector 830.

Accordingly, both DLL 220 and DLL 810 are preferably fixed to one period of a reference clock signal (not shown) input into the first delay element of each delay line. DLLs 220 and 810 also ideally include additional elements (e.g., a phase detector, a charge pump and a low pass filter) that comprise a stabilization circuit, as described above by reference to FIG. 2 and not shown in FIG. 8, to ensure stability of the respective DLLs during operation. In addition, as described above by reference to FIG. 2, DLL 220 ideally includes N output taps (e.g., from the input of D1 through the input of DN) to supply N phase shifted clock signals to the input of coarse delay selector 270. Likewise, DLL 810 ideally includes N+1 output taps (e.g., from the input of D1 through the input of D(N+1)) to supply N+1 phase shifted clock signals to the input of coarse delay selector 820. Moreover, both DLLs 220 and 810 are ideally locked to the same overall delay, e.g., one period of the clock signal.

As can be seen from FIG. 8, the DPC 800 with the training apparatus has two DLLs, each having coupled thereto its own multiplexer. Each multiplexer 270 and 820 is controlled by control device 280, and in this embodiment by the DPS 282. Moreover, in this embodiment of the present invention implementing training, the sequencer 282 performs two functions. It performs the function of a digital-to-phase sequencer when DPC 800 is generating a synthesized signal 292 that has substantially a desired frequency. It also functions as a training sequencer (ideally when the synthesized signal 292 is not being generated) when the DPC is performing the training function to calibrate itself. During training, sequencer 282 performs a sequence of steps (that are ideally predetermined) to: provide initial inputs to each multiplexer 270 and 820 to generate a first differential delay; wait for the phase detector to indicate a "lock" status, wherein the differential delay is substantially zero; and provide subsequent inputs to each multiplexer 270 and 820 to generate subsequent delays until the variable delay cell 290 has preferably been calibrated for each possible differential delay.

Figure 9:
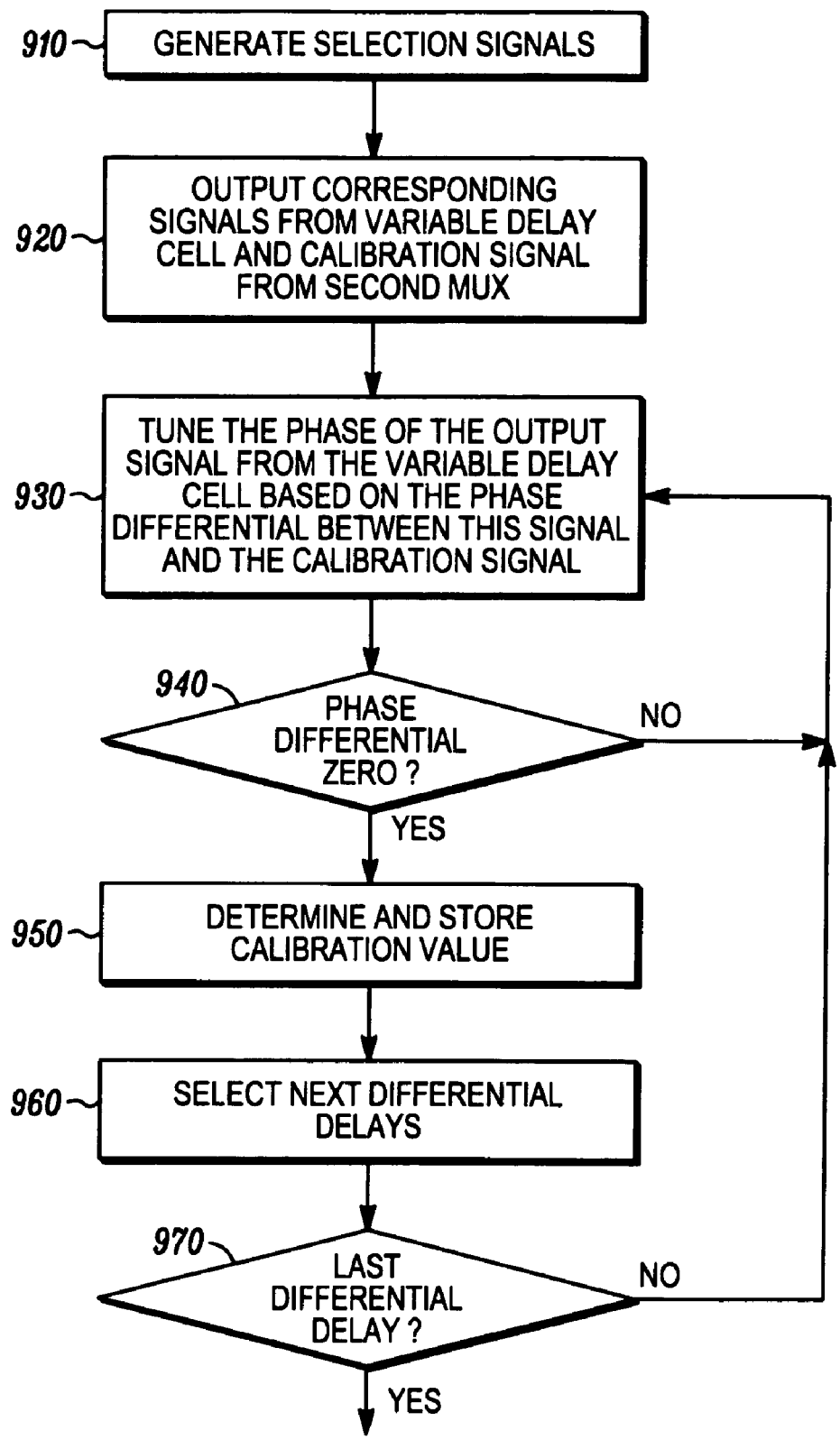
FIG. 9 illustrates a flow diagram of a method for performing a training sequence in accordance with an embodiment of the present invention.

FIG. 9 is a flow diagram that illustrates a method for training a DPC (for example DPC 800) using a training sequence in accordance with an embodiment of the present invention. During training, the sequencer 282 generates (910) a selection signal 286 that corresponds to a tap output of DLL 220 and a selection signal 285 that corresponds to a tap output of DLL 810. Preferably, the initial selection signal 286 corresponds to the output tap from the output of D1 of DLL 220, and the initial selection signal 285 corresponds to the output tap from the output of D1 of DLL 810. At step 920, MUX 270 receives selection signal 286 and based upon this selection signal selects the corresponding output tap and outputs the corresponding phase-shifted clock signal 272 to the variable delay cell 290. Likewise, MUX 820 receives selection signal 285 and based upon this selection signal selects the corresponding output tap and outputs the corresponding phase-shifted clock signal 822 (i.e., also referred to herein as a calibration signal) to the phase detector 830.

Phase detector 830 compares the phase of signal 292 from the output of variable delay cell 290 to the phase of calibration signal 822 and outputs a phase error signal 832 that is indicative of the difference between the two phases, i.e., the phase differential or differential delay. Based on this phase error signal, the DPS generates a digital differential value 288 that is converted by the DAC 284 to an analog differential signal 289 that is used by the variable delay cell 290 to modify the phase of signal 292 toward the phase of the calibration signal 822, at step 930. Variable delay cell 290 continues to modify the phase of signal 292 until the phase detector generates a phase error signal 832 that indicates that the variable delay cell has made the two phases substantially coincident, and there is substantially no phase differential (940), i.e., the variable delay cell is tuned.

This point of zero phase differential further corresponds to a calibration point on the transfer function curve for variable delay cell 290. Moreover, this calibration point may be used by the control device to calculate (950) a calibration value that is ideally a digital word that corresponds to a fine tune adjustment signal that is needed to make the phase of signal 292 substantially the same as the phase of the calibration signal 822. The calibration value may be stored (950) in a memory device such as, for instance, a Random Access Memory. A memory device 840 may be optionally included, for example, in the control device 280 ideally coupled to or incorporated as part of DPS 282.

The sequencer then generates the next selection signals corresponding to the next differential delay and the variable delay cell is calibrated for this differential delay. The process repeats until the variable delay cell is calibrated ideally for each possible differential delay (960, 970), such that a transfer function curve for the delay cell is generated having N calibration points. Calibration values may be generated based upon each of these calibration points that may, likewise, be stored in memory device 840. Control device 280 may further perform an interpolation method or algorithm, for example linear interpolation, quadratic interpolation, etc., to compute additional calibration values from at least two of the ones already determined. These interpolated calibration values are also ideally stored in memory.

As stated above, the spurious performance of the DPC is related to the number of possible calibration values based upon the number of bits of the DAC. Thus, using the architecture of the embodiment of the present invention illustrated in FIG. 8, it would be possible to exceed an 80 dB spurious performance using an eight bit DAC and a 32 tap DLL, which would yield $32*2^8$ or (8192) possible delay combinations. A ten bit DAC and a 32 tap DLL would yield $32*2^{10}$ (or 32768) possible delay combinations, which corresponds to a spurious performance of better than 92 dB.

Figure 10:
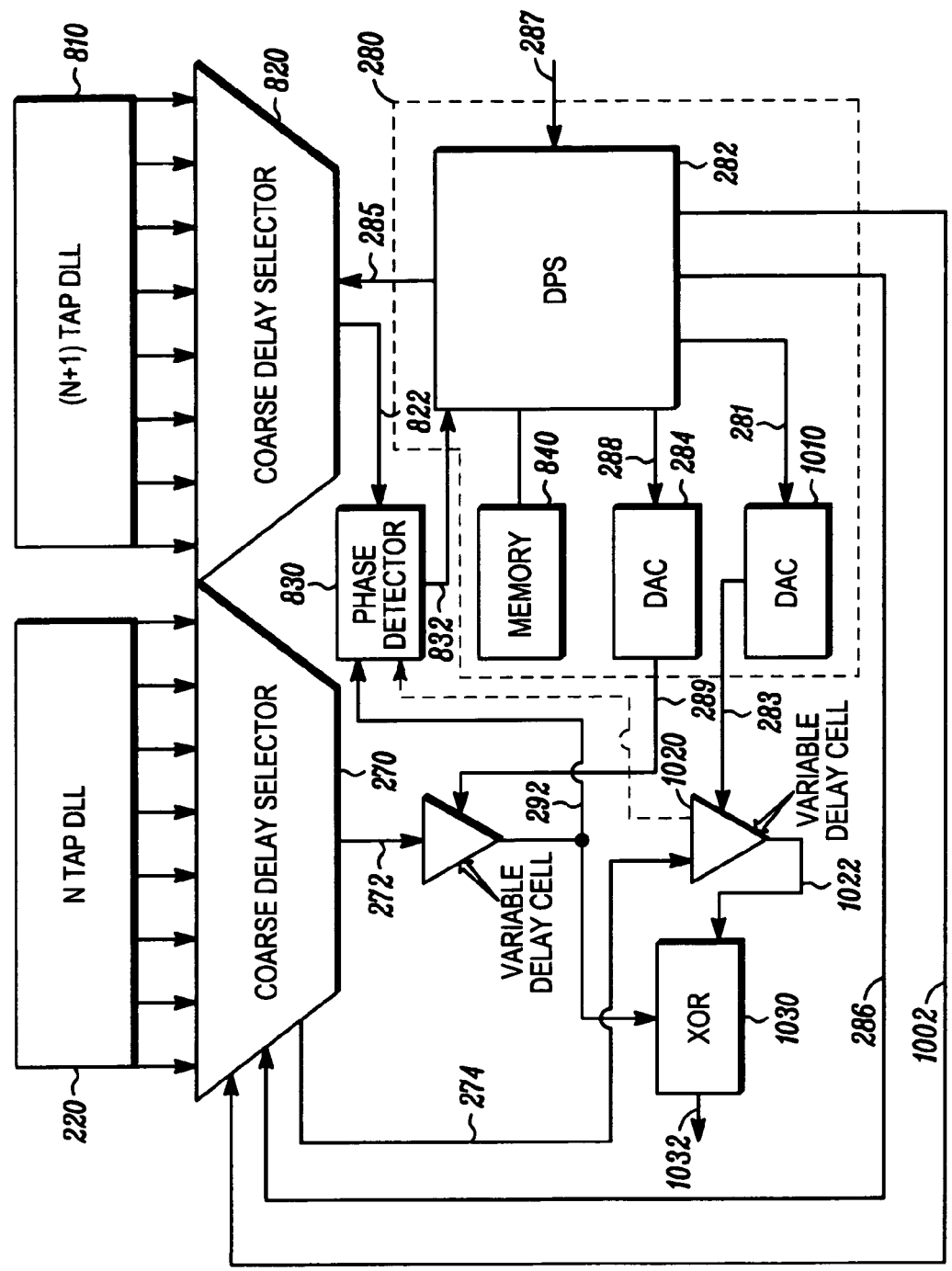
FIG. 10 illustrates a block diagram of a digital-to-phase converter in accordance with another embodiment of the present invention that includes apparatus for performing a training sequence.

Another embodiment of the present invention is a frequency multiplier. Using additional variable delay cells, corresponding DACs, and some combinational logic, another embodiment of the DPC could be implemented that could synthesize signals having a higher frequency than the frequency of the reference clock signal based, in part, upon the number of additional variable delay cells added. FIG. 10 illustrates a DPC 1000 in accordance with another embodiment of the present invention, i.e., a frequency doubler. DPC 1000 includes all of the elements of DPC 800 and these elements are identically labeled. Thus DPC 1000 includes: a DLL 220 with a delay line (not shown) having N delay elements; a coarse delay selector (or multiplexer) 270; a control device 280 preferably including a DPS 282 and a DAC 284; a variable delay cell 290; and training apparatus that ideally comprises a DLL 810 with a delay line (not shown) having N+1 delay elements, a coarse delay selector (or multiplexer) 820, a phase detector 830, and a memory device 840. These elements of DPC 1000 have the same functionality as described in detail above by reference to FIG. 8, which will not be repeated here for the sake of brevity.

To enable the additional frequency doubling functionality, DPC 1000 also includes: a second variable delay cell 1020 that is ideally identical to variable delay cell 290; a second DAC 1010 coupled between DPS 282 and an input of variable delay cell 1020; and a logic device 1030 coupled to the outputs of both variable delay cells 290 and 1020. In this embodiment, logic device 1030 is an exclusive or (XOR) logic device, but it is appreciated by those of ordinary skill in the art that logic device 1030 may be any suitable logic device necessary for combining the output signals of the variable delay cells to generate a synthesized signal having substantially the desired output frequency. The additional variable delay cell may also be coupled to the training apparatus as illustrated by the dashed line in FIG. 10 so that it may be calibrated when necessary. A corresponding set of calibration values for the variable delay cell 1020 may also be stored in memory 840. Alternatively, the DPC may use the calibration values stored for the variable delay cell 290 to generate the fine tune adjustment signal for the variable delay cell 1020.

Figure 11:
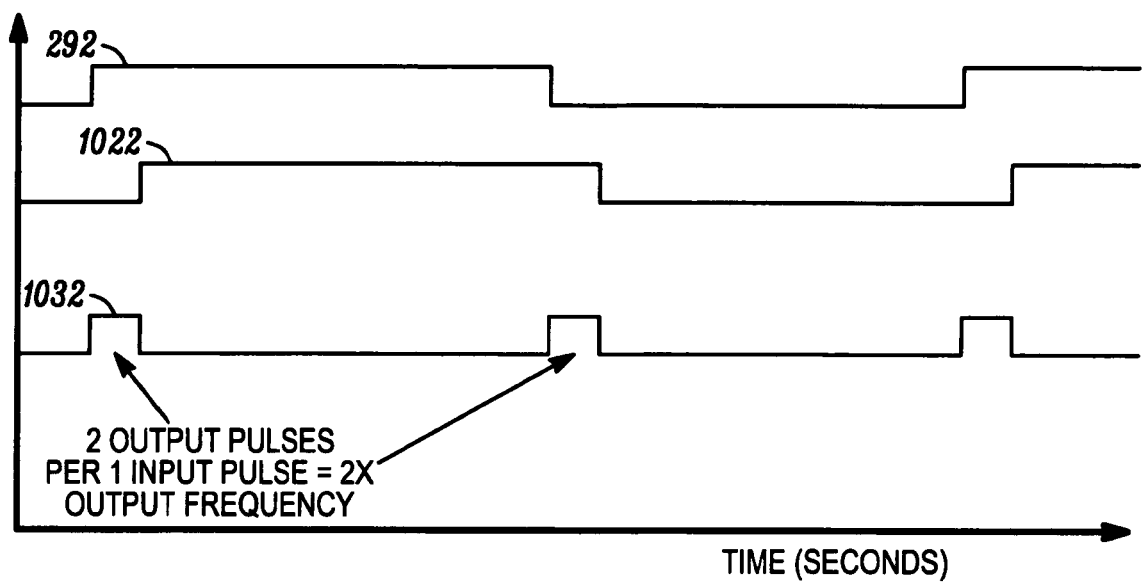
FIG. 11 illustrates a set of timing diagrams demonstrating exclusive—or frequency doubling in accordance with an embodiment of the present invention.

In operation, DPS 282 generates a second coarse selection signal 1002 that causes coarse delay selector 270 to select a corresponding second sequence of phase-shifted clock signals and to output a corresponding second coarse synthesized signal 274 to variable delay cell 1020. DPS 282 also generates a digital fine tune adjustment value 281 that is converted by DAC 1010 into an analog fine tune adjustment signal 283. Variable delay cell 1020 then modifies signal 274 as a function of signal 283 to generate a second synthesized signal 1022. Signals 292 and 1022 are then combined using XOR 1030 to generate a combined output synthesized signal 1032 having substantially the desired frequency. This XOR function of the outputs 292 and 1022, respectively, of variable delay cells 290 and 1020 yields an output 1032 indicating the differences in states of the two signals. As illustrated in FIG. 11, this results in two output pulses for every output pulse of variable delay cell 290, essentially doubling the output frequency and doubling the range of operation of DPC 1000.

Only one additional variable delay element and one additional DAC was shown in FIG. 10 to double the frequency output range of the DPC. Those of ordinary skill in the art will realize that additional variable delay elements and corresponding DACs may be included in the DPC in a manner similar to that described by reference to FIG. 10 to further increase the frequency output range of the DPC. The extent to which the range is increased is proportional to the number additional elements used.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

What is claimed is:

1. A digital-to-phase converter (DPC) comprising:
   a frequency source for providing a clock signal having a first frequency;
   at least a first delay-locked loop configured to receive the clock signal for generating a first plurality of phase-shifted clock signals, each phase-shifted clock signal having substantially the first frequency and being shifted in phase with respect to the clock signal and with respect to the other phase-shifted clock signals in the first plurality;
   a control device coupled to the frequency source and configured for receiving an input signal identifying a desired frequency for a synthesized signal;
   at least a first selection circuit for receiving the first plurality of phase-shifted clock signals and for selecting, one at a time and under the control of the control device, at least one sequence of the phase-shifted clock signals in the first plurality and outputting a corresponding coarse synthesized signal based on each sequence; and
   at least a first variable delay cell having a first input coupled to the selection circuit to receive the corresponding coarse synthesized signal and a second input coupled to the control device, wherein the control device further generates at least one fine tune adjustment signal used by the first variable delay cell to modify the corresponding coarse synthesized signal using a plurality of different delay amounts to generate at an output of the first variable delay cell a first fine synthesized signal.

2. The DPC of claim 1, wherein the first fine synthesized signal generated at the output of the first variable delay cell has substantially the desired frequency.

3. The DPC of claim 1, wherein the control device comprises:
   a digital-to-phase sequencer (DPS) coupled to the first selection circuit and to the frequency source; and
   at least a first digital to analog converter (DAC) coupled between the DPS and the at least a first variable delay cell for receiving at least a first digital fine tune adjustment value and converting it into at least a first analog fine tune adjustment signal for use by the at least a first variable delay cell.

4. The DPC of claim 1 further comprising training apparatus coupled to the at least a first variable delay cell and to the control device for generating at least one calibration signal used to generate at least one set of calibration values that are further used by the control device to generate the at least one fine tune adjustment signal.

5. The DPC of claim 4, wherein the first delay-locked loop includes a first number of delay cells and wherein the training apparatus comprises:
   a second delay-locked loop having a second number of delay cells and configured to receive the clock signal for generating a second plurality of phase-shifted clock signals, each phase-shifted clock signal having substantially the first frequency and being shifted in phase with respect to the clock signal and with respect to the other phase-shifted clock signals in the second plurality;
   a second selection circuit for receiving the second plurality of phase-shifted clock signals and outputting, under the control of the control device, the at least one calibration signal at an output of the second selection circuit; and
   a phase detector coupled to the output of the at least a first variable delay cell and to the output of the second selection circuit for using the at least one calibration signal in providing at least one phase error signal to the control device for use in generating the at least one set of calibration values.

6. The DPC of claim 5 further comprising a memory device included in the control device for storing the at least one set of calibration values.

7. The DPC of claim 5, wherein the first number of delay cells and the second number of delay cells differ by at least one delay cell.

8. The DPC of claim 1 further comprising:
   a second variable delay cell having a first input coupled to the selection circuit to receive the corresponding coarse synthesized signal and a second input coupled to the control device, wherein the control device further generates a second fine tune adjustment signal used by the second variable delay cell to modify the corresponding coarse synthesized signal to generate at an output of the second variable delay cell a second fine synthesized signal; and
   a logic device for combining the first and second fine synthesized signals for generating a combined synthesized signal having substantially the desired frequency.

9. The DPC of claim 8, wherein the logic device is an exclusive-or logic device.

10. A digital-to-phase converter (DPC) comprising:
    a frequency source for providing a clock signal having a first frequency;
    at least a first delay-locked loop configured to receive the clock signal for generating a first plurality of phase-shifted clock signals, each phase-shifted clock signal having substantially the first frequency and being shifted in phase with respect to the clock signal and with respect to the other phase-shifted clock signals in the first plurality;
    a control device coupled to the frequency source and configured for receiving an input signal identifying a desired frequency for a synthesized signal;
    at least a first selection circuit for receiving the first plurality of phase-shifted clock signals and for selecting, one at a time and under the control of the control device, at least one sequence of the phase-shifted clock signals in the first plurality and outputting a corresponding coarse synthesized signal based on each sequence;

at least a first variable delay cell having a first input coupled to the selection circuit to receive the corresponding coarse synthesized signal and a second input coupled to the control device, wherein the control device further generates at least one fine tune adjustment signal used by the at least a first variable delay cell to modify the corresponding coarse synthesized signal to generate at an output of the at least a first variable delay cell at least a first fine synthesized signal; and training apparatus coupled to the at least a first variable delay cell and to the control device for generating at least one calibration signal used to generate at least one set of calibration values that are further used by the control device to generate the at least one fine tune adjustment signal, the training apparatus comprising:

a second delay-locked loop having a second number of delay cells and configured to receive the clock signal for generating a second plurality of phase-shifted clock signals, each phase-shifted clock signal having substantially the first frequency and being shifted in phase with respect to the clock signal and with respect to the other phase-shifted clock signals in the second plurality;

a second selection circuit for receiving the second plurality of phase-shifted clock signals and outputting, under the control of the control device, a calibration signal at an output of the second selection circuit; and a phase detector coupled to the output of the at least a first variable delay cell and to the output of the second selection circuit for using the at least one calibration signal in providing at least one phase error signal to the control device for use in generating the at least one set of calibration values.

11. A method for generating a synthesized signal, comprising the steps of:

receiving a clock signal having a first frequency;

receiving an input signal identifying a desired frequency for a synthesized signal;

generating at least one coarse selection signal for causing at least one sequence of phase-shifted clock signals to be selected, from a first plurality of phase-shifted clock signals, each phase-shifted clock signal having substantially the first frequency and being shifted in phase with respect to the clock signal and with respect to the other phase-shifted clock signals in the first plurality, and for further causing at least one coarse synthesized signal to be output based on the at least one sequence; and generating at least a first fine adjustment signal for controlling a variable delay cell to modify the course synthesized signal using a plurality of different delay amounts to generate a first fine synthesized signal.

12. The method of claim 11, wherein the first fine synthesized signal has substantially the desired frequency.

13. The method of claim 11 further comprising the steps of:

generating a second fine synthesized signal; and combining the first and second fine synthesized signals to generate a combined synthesized signal having substantially the desired frequency.

14. The method of claim 11 farther comprising the step of performing a training sequence at a time when the at least a first fine synthesized signal is not being generated.

15. The method of claim 14, wherein the at least a first fine synthesized signal is generated and the training sequence is performed in the same communication device.

16. The method of claim 14, wherein the training sequence comprises the steps of:

generating a first selection signal for causing at least one first phase-shifted clock signal to be selected, from the first plurality of phase shifted clock signals, and to be used to generate an output signal having a first phase;

generating a second selection signal for causing at least one second phase-shifted clock signal to be selected, from a second plurality of phase-shifted clock signals, each phase-shifted clock signal having substantially the first frequency and being shifted in phase with respect to the clock signal and with respect to the other phase-shifted clock signals in the second plurality, and to be used to generate a calibration signal having a second phase;

generating a differential signal based on the difference between the first and second phase to be used for modifying the first phase until the first phase is substantially the same as the second phase, indicating a calibration point; and generating a calibration value corresponding to each calibration point.

17. The method of claim 16 further comprising the step of storing each calibration value.

18. The method of claim 16, wherein each calibration value is a digital value corresponding to a fine tune adjustment signal needed to make the first phase substantially the same as the second phase.

19. The method of claim 16 further comprising computing at least one additional calibration value from at least two generated calibration values.

20. The method of claim 19, wherein the at least one additional calibration value is computed using interpolation.

* * * * *